US008057894B2

(12) United States Patent
Kim et al.

(10) Patent No.: US 8,057,894 B2
(45) Date of Patent: Nov. 15, 2011

(54) ADHESIVE TAPE FOR ELECTRONIC COMPONENTS

(75) Inventors: Sang-Pil Kim, Gyeongsangbuk-do (KR); Ki-Jeong Moon, Daegu (KR); Woo-Seok Kim, Gyeonggi-do (KR)

(73) Assignee: Toray Advanced Materials Korea, Inc., Gyeongsangbuk-do (KR)

( * ) Notice: Subject to any disclaimer, the term of this patent is extended or adjusted under 35 U.S.C. 154(b) by 415 days.

(21) Appl. No.: 11/197,322

(22) Filed: Aug. 5, 2005

(65) Prior Publication Data
US 2006/0286375 A1    Dec. 21, 2006

Related U.S. Application Data

(63) Continuation-in-part of application No. 11/107,894, filed on Apr. 18, 2005, now abandoned.

(30) Foreign Application Priority Data

Oct. 22, 2004 (KR) .................. 10-2004-0084712
Jun. 21, 2005 (KR) .................. 10-2005-0053707

(51) Int. Cl.
*B32B 7/12* (2006.01)

(52) U.S. Cl. .............. 428/343; 428/355 R; 428/355 EP; 428/355 BL; 428/355 CN

(58) Field of Classification Search .................... 428/343
See application file for complete search history.

(56) References Cited

U.S. PATENT DOCUMENTS

| | | | | |
|---|---|---|---|---|
| 3,687,894 A * | 8/1972 | Collings et al. | ................ | 528/102 |
| 4,289,843 A * | 9/1981 | Boutle et al. | ................ | 430/271.1 |
| 4,473,674 A * | 9/1984 | Stoakley et al. | .............. | 523/454 |
| 4,578,315 A * | 3/1986 | Santorelli | ................ | 428/414 |
| 5,019,617 A * | 5/1991 | Kaidoo et al. | ................ | 524/346 |
| 5,160,783 A | 11/1992 | Nemoto et al. | ................ | 442/67 |
| 5,683,806 A * | 11/1997 | Sakumoto et al. | ............ | 428/343 |
| 6,048,576 A * | 4/2000 | Hwail et al. | ................ | 427/208 |
| 6,303,219 B1 * | 10/2001 | Sawamura et al. | ............ | 428/343 |
| 6,777,079 B2 | 8/2004 | Zhiming | ................ | 428/355 |
| 7,247,683 B2 | 7/2007 | Hurley et al. | ................ | 525/481 |
| 2003/0190466 A1 | 10/2003 | Nakaba et al. | ................ | 428/344 |
| 2004/0230000 A1 | 11/2004 | Misumi et al. | ................ | 525/128 |
| 2006/0089465 A1 | 4/2006 | Kim et al. | ................ | 525/486 |
| 2006/0106166 A1 | 5/2006 | Inada et al. | ................ | 525/109 |
| 2008/0226884 A1 | 9/2008 | Sim et al. | ................ | 428/216 |
| 2009/0011166 A1 * | 1/2009 | Kim et al. | ................ | 428/41.8 |

FOREIGN PATENT DOCUMENTS

| | | |
|---|---|---|
| JP | S60-196956 | 10/1985 |
| JP | S60-223139 | 11/1985 |
| JP | S61-211016 | 9/1986 |
| JP | S62-040183 | 2/1987 |
| JP | S62-141082 | 6/1987 |
| JP | H07-157739 | 6/1995 |
| KR | 10-1998-0068284 | 12/1998 |
| KR | 10-2001-0052801 | 6/2000 |
| KR | 10-2000-0048223 | 7/2000 |
| KR | 10-2002-0009144 | 2/2002 |
| KR | 10-2002-0075426 | 10/2002 |
| KR | 10-2003-0038147 | 5/2003 |
| KR | 10-2003-0093247 | 12/2003 |
| KR | 10-2004-0009616 A | 1/2004 |
| KR | 10-2004-0084712 | 10/2004 |
| KR | 10-2005-0044259 | 5/2005 |
| KR | 10-2006-0045432 | 5/2006 |
| WO | WO 95/20820 | 8/1995 |

OTHER PUBLICATIONS

Chemical Formula of Cresol Novolac epoxy resin. Available at http://www.hexionchem.co.kr/product/images/pro_01_28.gif, last accessed on Dec. 1, 2006.*
"Heat sensitive adhesive in film form, prodn.—by rolling a mix. of liquid and solid nitrile rubbers, phenolic resin powder and additives", Derwent Abstract of JP 48066140, Sep. 11, 1973.*
E. W. Meijer, "A Model Study for Coatings Containing Hexamethoxymethylmelamine", Journal of Polymer Science: Part A: Polymer Chemistry, vol. 24, 2199-2208, 1986.*
Phthalic Anhydride, Hawley's Condensed Chemical Dictionary, 14th Edition, 2002.*
Fred. W. Billmeyer, Jr., Textbook of Polymer Science, 3rd edition, John Wiley and Sons, Inc., pp. 437-438, 1984.*
"Acrylonitrile-Butadiene Rubber (NBR)", available at http://www.iisrp.com/WebPolymers/07NBR-18Feb2002.pdf, last accessed Dec. 18, 2009.*
"Bismaleimides" by HOS Technik, available at http://www.hos-tec.com/index.php?option=com_content&task=view&id=7&Itemid=9, last visited on Sep. 2, 2010.*
Office Action, dated Dec. 19, 2007 issued in U.S. Appl. No. 11/107,894.
Office Action, dated Apr. 17, 2008 issued in U.S. Appl. No. 11/107,894.
Office Action, dated Apr. 15, 2010 issued in U.S. Appl. No. 12/190,241.

* cited by examiner

*Primary Examiner* — Alicia Chevalier
*Assistant Examiner* — Anish Desai
(74) *Attorney, Agent, or Firm* — Harness, Dickey & Pierce, P.L.C.; Anthony G. Fussner; Kisuk Lee

(57) ABSTRACT

An adhesive tape for attaching and fixing electronic components has an adhesive layer on at least one surface of a heat-resistant film. The surface hardness of the adhesive layer is about more than 25 MPa, and the surface hardness of the adhesive layer is about more than 80 MPa after thermosetting at 200° C. for about one hour.

5 Claims, 2 Drawing Sheets

ADHESIVE TAPE FOR ELECTRONIC COMPONENTS

CROSS-REFERENCE TO RELATED APPLICATIONS

This application is a continuation-in-part of U. S. patent application Ser. No. 11/107,894 filed Apr. 18, 2005 which claims priority to Korean Patent Application No. 10-2004-0084712 filed Oct. 22, 2004.

RELATED APPLICATIONS

This present application is based on, and claims priority from, Korean Application Number 10-2005-0053707, filed Jun. 21, 2005, the disclosure of which is hereby incorporated by reference herein in its entirety.

BACKGROUND OF THE INVENTION

1. Technical Field

The invention relates to an adhesive tape, and, more particularly, to an adhesive tape for electronic components that can be used for bonding electronic components such as leads, heat sinks, semiconductor chips, die pads, and the like, excellent in taping capability and electric reliability.

2. Description of the Prior Art

Generally, typical adhesive tapes used for semiconductor devices include adhesive tapes for bonding lead frames, those for attaching heat sinks, TAB (Tape Automated Bonding) tapes, LOC (Lead On Chip) tapes, and the like. The adhesive tapes for bonding lead frames is used for fixing the lead of a lead frame to improve productivity and yields of the lead frame itself and in the overall semiconductor assembly process. A lead frame manufacturer applies the adhesive tape onto a lead frame, which is in turn delivered to a semiconductor assembling company, to equip semiconductor chips on the frame which is subject to wire bonding, etc. and then to seal the frame with an epoxy molding compound. Therefore the adhesive tape is contained in a semiconductor apparatus package.

The tapes such as the adhesive tape for attaching heat sinks are also contained in a semiconductor package, like the adhesive tapes for bonding lead frames.

Therefore, the adhesive tapes for electronic components must have general reliability and workability in taping for semiconductors, and sufficient physical properties that allow the tapes to resist severe conditions such as high temperature, humidity, voltage, etc. applied from the outside during the assembling process of a semiconductor device until they are used as final products after the assembling process, as well as excellent adhesiveness.

Typical adhesive tapes for electronic components used as such are made by applying only the synthetic rubbery resin of polyacrylonitrile resin, polyacrylate resin, resole phenol resin, or acrylonitrile-butadiene copolymer, etc. onto a heat-resistant film such as a polyimide film, or by applying an adhesive made on the film by modifying the resins to another resin or mixing the resins, and then being converted to B step through coating and drying the applied adhesive. Such a tape, however, introduces excessive bleeding of the adhesive in taping because its hardness is too low, which excessive bleeding causes the adhesive to stain taping devices or to bleed on unnecessary portions, which in turn results in defective semiconductor devices.

With the current micro- and highly-integrated package architecture resulting from a thin body and fine pitch structure of a semiconductor device, stringent requirements for organic materials such as adhesive tapes and the like used for the devices tend to be applied to their electric, chemical and physical properties. Accordingly, there has been a need for developing adhesive tape compositions for electronic components excellent in adhesiveness, workability and the like together with sufficient electric reliability and durability.

To solve the aforementioned problems, the applicant TORAY SAEHAN disclosed a document, titled "Heat-resistant adhesive tape for electronic components", of the Korea Patent Application No. 2002-0043621 (published Korea Pat. No. 2004-0009616) and a document, titled "Adhesive tape compositions for electric components" of the Korea Patent Application No. 2004-84712. With the compositions disclosed in the above patent specifications, many problems in adhesiveness, electric reliability and the like were much improved as compared to conventional adhesive tapes and the improved adhesive tape has been widely used in the relevant field currently.

As electronic and semiconductor components continue to develop with a micro-, thin- and highly-integrated structure in the electronic industry, there has been a need for continuous development of adhesive tapes for electronic components to catch up with the trend. The invention was designed during the research to improve the problems of conventional adhesive tapes for electronic components.

BRIEF SUMMARY OF THE INVENTION

The invention was conceived to solve the aforementioned problems. It is an object of the invention to provide an adhesive tape excellent in electric reliability and taping capability.

BRIEF DESCRIPTION OF THE DRAWINGS

The features and advantages of the present invention will become apparent by reading the following detailed description of preferred embodiments thereof illustrated with reference to the accompanying drawings, wherein.

DETAILED DESCRIPTION OF THE PREFERRED EMBODIMENT

The adhesive tape for electronic components according to the invention to achieve the aforementioned object, having an adhesive layer 20 on at least one surface of a heat-resistant film, is characterized in that the surface hardness of the adhesive layer 20 is more than about 25 Mpa. Preferably, the surface hardness of the adhesive layer 20 is characterized in that it is more than about 80 MPa after thermosetting for one hour at 200° C.

Hereinafter, referring to the embodiments and drawings of the invention, the invention will be described in detail. It will be apparent to those skilled in the art that those embodiments are intended to illustrate the invention more specifically, but the scope of the invention should not be limited to those embodiments according to the teaching of the invention.

The inventors studied to solve the problems occurring when using conventional adhesive tapes for electronic components, then recognized that it is an important factor to increase the hardness of adhesive in order to improve electric reliability and taping capability thereof, and conceived the invention.

Figure 1:
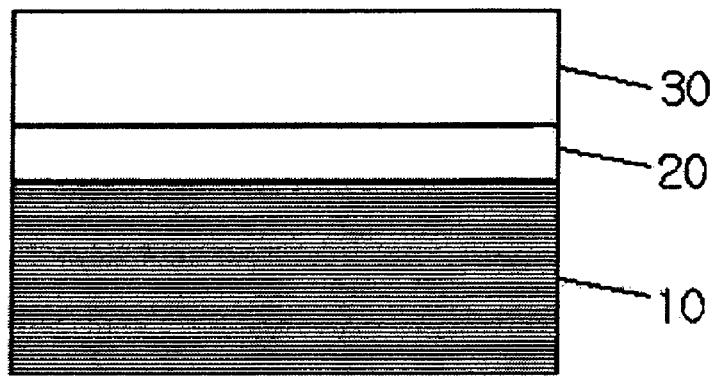
FIG. 1 shows a cross section of an adhesive tape for electronic components according to one embodiment of the invention.

FIG. 1 is a cross sectional view of an adhesive tape for electronic components according to one embodiment of the invention. On one surface of a heat-resistant film 10 is formed an adhesive layer 20 and on top of the layer 20, a release film 30 is laminated, as shown in FIG. 1.

Figure 2:
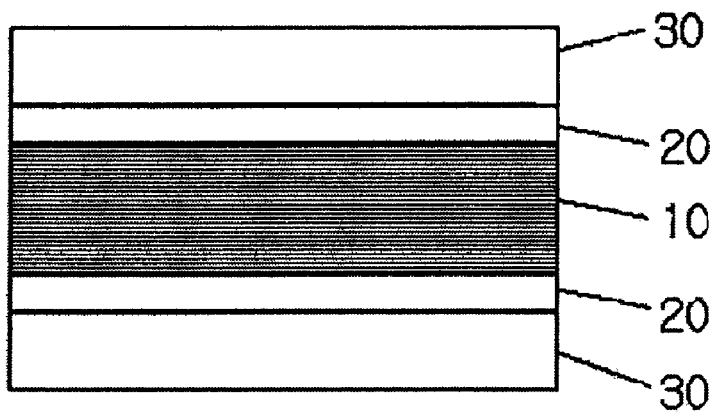
FIG. 2 shows a cross section of an adhesive tape for electronic components according to another embodiment of the invention.

FIG. 2 is a cross sectional view of another adhesive tape for electronic components according to one embodiment of the invention, in which adhesive layers 20 are formed on both sides of a heat-resistant film 10 and a release film 30 is laminated on the surface of each adhesive layer 20. The heat-resistant film 10 may be a heat-resistant film of polyimide, polyphenylenesulfide, or polyethyleneterephthalate, but most preferably a polyimide film. If the heat-resistant film is too thick (70 μm or more) or too thin (10 μm or less), it is not easy to carry out tape punching in taping. Therefore, it is preferable that the thickness ranges 10 to 70 μm, but more preferably 40 to 60 μm.

The adhesive layer 20 has a ratio of 3 to 300 weight portions of polyfunctional epoxy resin and 3 to 300 weight portions of polyfunctional phenol resin for 100 weight of NBR containing the carboxyl radical, wherein the layer 20 contains a hardener, a rubber cross linking agent and other additives.

The release film 30 has a thickness of 20 to 100 μm, preferably 30 to 60 μm. The release film 30 may be a polyethylene, polyethylene terephthalate, or polypropylene film, to which release capability may be given with silicon resin, if required.

Embodiment 1

To 200 weight of NBR (containing 27.1 weight % of the acrylonitrile content and 4.3 weight % of the carboxyl radical content) were added 100 weight portions of novolac epoxy resin represented in the following chemical formula 1, 100 weight portions of phenol resin represented in the following chemical formula 2, 3 weight portions of hexamethoxy methylmelamine and 3 weight portions of phthalic anhydride as a hardener, and then 10 weight portions of zinc oxide as a rubber cross linking agent. The viscosity of the resulting solution was then adjusted to 400 to 1,500 CPS, using acetone solvent. Subsequently the adhesive liquid was sufficiently agitated, and then applied onto the surface of a polyimide film whose thickness was 50 μm so that the thickness of the adhesive layer could be 20 μm after being dried. After drying the adhesive liquid (at 180° C., for 10 minutes), a polyethylene terephtalate film whose thickness was 38 μm was laminated to produce an adhesive tape.

[Chemical formula 1]

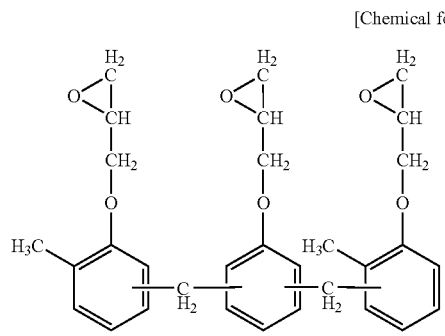

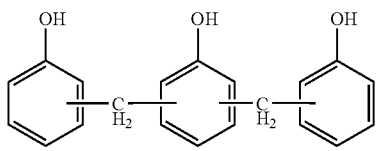

[Chemical formula 2]

Embodiment 2

An adhesive tape was produced with the same method and conditions as in the embodiment 1, except that the adhesive liquid was dried at 170° C. for 10 minutes.

Embodiment 3

An adhesive tape was produced with the same method and conditions as in the embodiment 1, except that the adhesive liquid was dried at 160° C. for 10 minutes.

Embodiment 4

An adhesive tape was produced with the same method and conditions as in the embodiment 1, except that the adhesive liquid was dried at 150° C. for 10 minutes.

Embodiment 5

An adhesive tape was produced with the same method and conditions as in the embodiment 1, except that the adhesive liquid was dried at 140° C. for 10 minutes.

Embodiment 6

An adhesive tape was produced with the same method and conditions as in the embodiment 1, except that the adhesive liquid was dried at 130° C. for 10 minutes.

COMPARATIVE EXAMPLE 1

To 100 weight of Tetrabromo-bisphenol A(TBBA) epoxy are added 50 weight portions of cresol novolac epoxy with a low softening point, 30 weight portions of acrylonytrile-butadiene rubber, 20 weight portions of polybenzo imidazole, and 12 weight portions of diaminodiphenyl sulfone, in order to produce 1000 to 1200 CPS of the liquid viscosity, using methylethyl ketone, toluene and DMF as a solvent. After fully agitating the resultant adhesive liquid, the liquid was applied onto a polyimide film whose thickness was 50 μm to make a layer whose thickness was 20 μm after drying the liquid. After drying the liquid (at 120° C. for 3 minutes), a polyethylene terephthalate film whose thickness was 38 μm was laminated to produce an adhesive tape (the adhesive tape was produced according to the embodiment 1, using the "An adhesive composition for heat-resistant adhesive tapes" described in the published Korea patent No. 1998-0068284).

Hereinafter, the method of testing characteristics of the adhesive tapes according to the embodiments and the comparative example, and the test results will be described.

[Testing Taping Capability]

The adhesive tapes for electronic components produced according to the embodiments and the comparative example were taped on a lead frame for 216 pin QFP at 180° C., for 0.2 seconds and under 5 kg/cm², using the taping machine available from Poschl Co., in order to test running capability of the machine and characteristics of the tapes. The result thereof are shown in the following Table 1.

TABLE 1

| Test Item | Embodiment 1 | Embodiment 2 | Embodiment 3 | Embodiment 4 | Embodiment 5 | Embodiment 6 | Comparative example 1 |
|---|---|---|---|---|---|---|---|
| Number of surface tucks | 0 | 0 | 0 | 0 | 0 | 1 | 7 |
| Running capability (Number of stops) | 0 | 0 | 0 | 0 | 0 | 2 | 6 |
| Ratio of defective lead frames (%) | 0.3 | 0.7 | 0.5 | 0.6 | 1.4 | 17.8 | 53.3 |

The adhesive tapes of 22 mm×1000 m were applied, and test items are described below.
(1) Surface tuck: The number of tucks occurring during applying a tape of 1000 m in length.
(2) Running capability (number of stops): the number of stops when the taping machine stops due to excessive bleeding of the adhesive.
(3) Ratio of defective lead frames (%): a defective lead frame is decided when the adhesive drops on a place other than the places not for adhesion, so that a lead is connected to an adjacent lead.

As seen in the above Table 1, the tapes produced according to the comparative example 1 and the embodiment 6 generate tucks on their surface because of their low surface hardness (see the following Table 2). Because of excessive bleeding of the adhesive layer, the adhesive spreads on the taping machine and the adjacent lead, causing defective lead frames and problems in running capability of the taping machine. The tapes produced according to the embodiments 1 to 5, however, didn't generate tucks on their surface because of their high hardness (see the following Table 2) and didn't cause problems in running capability of the taping machine.

[Measuring Hardness of Adhesive]

With a nanoindenter, the surface hardness of the adhesive layers produced according to the embodiments and the comparative example was measured. After curing the tapes with the same method at 200° C. for one hour (general post heating condition for a tape for electronic components), the surface hardness was also measured. Test conditions are shown below and the result thereof is shown in Table 2.

Loading: strain rate=0.1,
Tip: DCM C1610,
Method: DCM CSM Hardness.

[Testing Electric Reliability]

Figure 3:
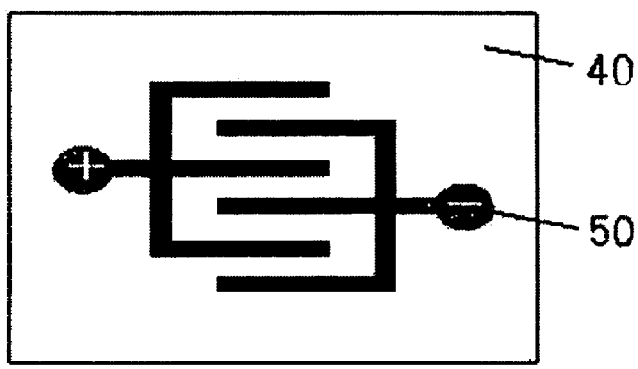
FIG. 3 schematically shows a specimen for testing electric reliability of an adhesive tape for electronic components according to the invention.
Figure 4:
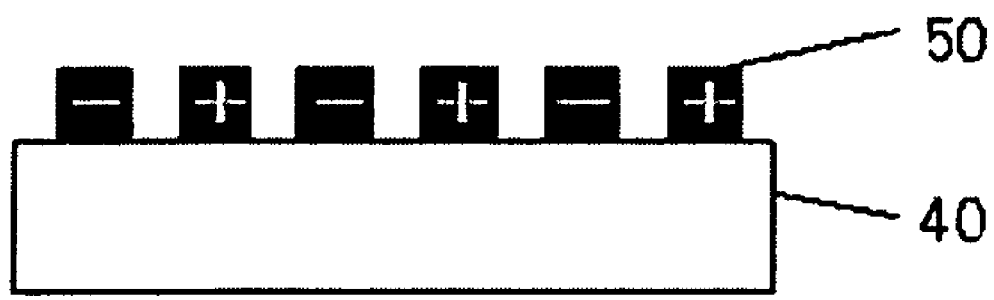
FIG. 4 shows a cross section of a specimen for testing electric reliability of an adhesive tape for electronic components according to the invention.

FIG. 3 is a schematic view of a specimen for testing electric reliability of an adhesive tape for electronic components according to the invention, which specimen was made by etching a copper film of a soft circuit board (the copper film was laminated on a polyimide film). FIG. 4 is a cross section of a specimen for testing electric reliability of an adhesive tape for electronic components according to the invention. As shown in FIGS. 3 and 4, the adhesive tapes produced according to the embodiments and the comparative example were thermocompressed on the specimen in which the distance between leads was 150 μm, at the pressure of 30 kg/m² for two minutes. Subsequently, the specimen was heated at 200° C. for one hour and then subject to testing electric reliability in order to measure changes in the resistance values over time for 100 hours at 135° C., under relative humidity of 85% at 5 volts. The results from the process for testing the characteristics as described above are shown in Table 2. Here, the voltage drop time means the time when the resistance value of the specimen drops by more than $10^2$ (order) due to the influence of the adhesive composition when testing the electric reliability. "N" means the case where voltage drop does not occur for 100 hours.

TABLE 2

| Test item | Embodiment 1 | Embodiment 2 | Embodiment 3 | Embodiment 4 | Embodiment 5 | Embodiment 6 | Comparative example 1 |
|---|---|---|---|---|---|---|---|
| Hardness before curing (MPa) | 105 | 94 | 67 | 54 | 25 | >1 | >1 |
| Hardness after curing (MPa) | 270 | 267 | 274 | 280 | 264 | 80 | 41 |
| Voltage drop time (hr) | N | N | N | N | N | N | 28 |

As seen in the above Table 2, the adhesive of the tape produced according to embodiment 6 has the same compositions as for the adhesive of the tapes produced according to the embodiments 1 to 5.

Because of insufficient drying conditions thereof, however, the hardness of the adhesive layer before curing was measured less than 1 Mpa, so that taping capability was thereby also measured bad. After sufficient post heating (at 200° C. for one hour), however, it showed similar characteristics to those of the adhesive tapes produced according to other embodiments. The adhesive of the tape produced according to the comparative example 1 is a kind of adhesive tape for electronic components made of the compositions according to prior art different from those of the embodiments, and has the adhesive hardness of 1 MPa or less and 41 MPa after postheating, which is relatively low as compared to those by the embodiments of the invention. Accordingly, the result in testing taping capability and electric reliability was not so good as the adhesive tapes produced according to the embodiments of the invention.

As seen in the above results, the adhesive tape for electronic components according to the invention showed excellence in taping capability and electric reliability as compared to the tapes produced according to the conventional technology.

In this specification, only some examples among various embodiments and analysis test carried out the inventors are illustrated, but it should be noted that the technical spirit of the invention is not limited to the examples, and that modifications and variations of the invention can performed by those skilled in the art.

What is claimed is:
1. An adhesive tape for electronic components, said adhesive tape comprising:
 a heat-resistant film, and
 an adhesive layer disposed on at least one surface of the heat-resistant film,
  wherein the adhesive layer is made from an adhesive composition consisting of:

3 to 300 weight portions of polyfunctional epoxy resin,
3 to 300 weight portions of polyfunctional phenol resin,
100 weight portions of NBR containing the carboxyl radical,
a hardener which is hexamethoxymethlmelamine and phthalic anhydride, and
a rubber cross linking agent.

2. The adhesive tape as claimed in claim 1, wherein said NBR contains 27.1% by weight of acrylonitrile and 4.3% by weight of the carboxyl radical.

3. The adhesive tape as claimed in claim 1, wherein said phenol resin is presented by the following formula

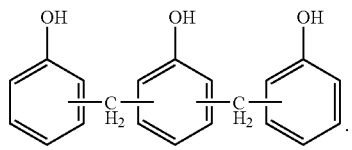

4. The adhesive tape as claimed in claim 1, wherein said rubber cross linking agent is zinc oxide.

5. The adhesive tape as claimed in claim 1, wherein said epoxy resin is presented by the following formula

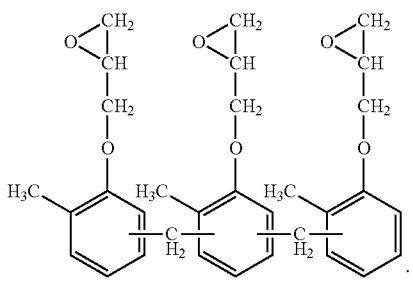

* * * * *